United States Patent
Miki et al.

(10) Patent No.: US 9,640,570 B2
(45) Date of Patent: May 2, 2017

(54) METHOD OF MANUFACTURING SOLID-STATE IMAGE SENSOR

(71) Applicant: CANON KABUSHIKI KAISHA, Tokyo (JP)

(72) Inventors: Takafumi Miki, Tokyo (JP); Masahiro Kobayashi, Tokyo (JP); Yusuke Onuki, Fujisawa (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 15/208,860

(22) Filed: Jul. 13, 2016

(65) Prior Publication Data
US 2017/0033145 A1 Feb. 2, 2017

(30) Foreign Application Priority Data
Jul. 29, 2015 (JP) .................................. 2015-149813

(51) Int. Cl.
*H01L 27/146* (2006.01)
*H01L 21/265* (2006.01)

(52) U.S. Cl.
CPC .. *H01L 27/14603* (2013.01); *H01L 21/26586* (2013.01); *H01L 27/14605* (2013.01); *H01L 27/14609* (2013.01); *H01L 27/14641* (2013.01); *H01L 27/14656* (2013.01); *H01L 27/14689* (2013.01)

(58) Field of Classification Search
CPC ......... H01L 27/14603; H01L 27/14605; H01L 27/14609; H01L 27/14689; H01L 21/26586
See application file for complete search history.

(56) References Cited

U.S. PATENT DOCUMENTS 8,558,293 B2    10/2013  Kawahito et al.
2016/0307949 A1*   10/2016  Madurawe ............. H04N 5/357

FOREIGN PATENT DOCUMENTS

WO    2011/043432 A1    4/2011

OTHER PUBLICATIONS

U.S. Appl. No. 15/163,986, filed May 25, 2016, Soda et al.

* cited by examiner

*Primary Examiner* — Fei Fei Yeung Lopez
(74) *Attorney, Agent, or Firm* — Fitzpatrick, Cella, Harper & Scinto

(57) ABSTRACT

A method of manufacturing a solid-state image sensor, including a first transistor for transferring charges from a charge accumulation region to a first charge holding region and a second transistor for transferring charges from the first charge holding region to a second charge holding region, the method comprising forming, on the semiconductor substrate, a resist pattern having a opening on the first charge holding region, and injecting a impurity via the opening so as to make the first charge holding region be a buried type, wherein the impurity is injected such that an impurity region, which makes the first charge holding region be a buried type, is formed at a position away from an end of the gate electrode of the second transistor.

15 Claims, 7 Drawing Sheets

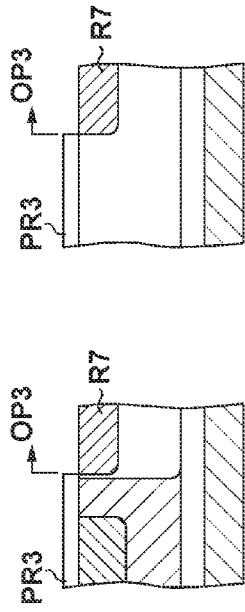
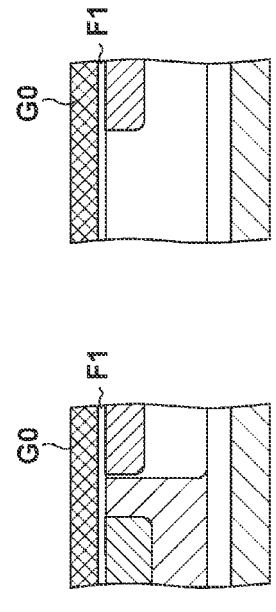

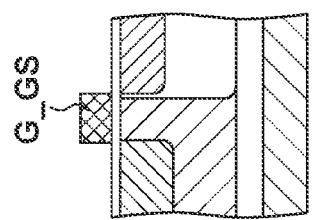
FIG. 3F1
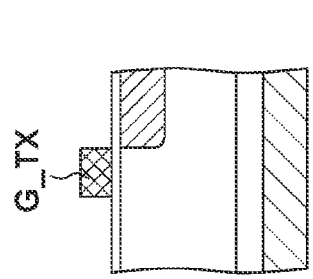
FIG. 3F2
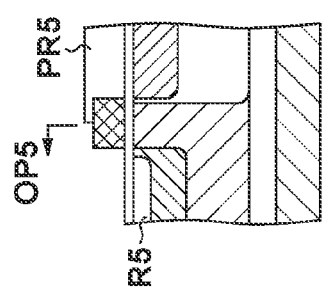
FIG. 3H1
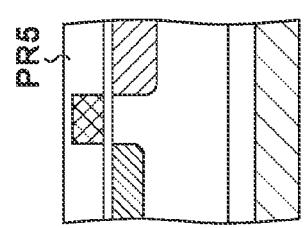
FIG. 3H2
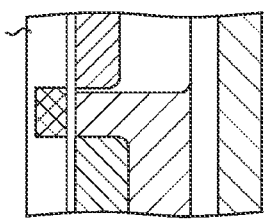
FIG. 3G1
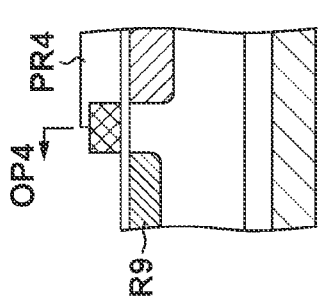
FIG. 3G2
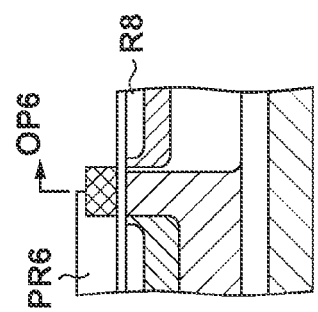
FIG. 3I1
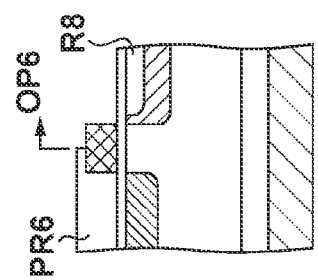
FIG. 3I2

METHOD OF MANUFACTURING SOLID-STATE IMAGE SENSOR

BACKGROUND OF THE INVENTION

Field of the Invention

The present invention relates to a method of manufacturing a solid-state image sensor.

Description of the Related Art

A solid-state image sensor includes a plurality of pixels formed on a semiconductor substrate. Each pixel can include, for example, a charge accumulation region in which charges generated by photoelectric conversion are accumulated, a charge holding region (floating diffusion), a transistor which transfers the charges from the charge accumulation region to the charge holding region, and the like.

Some solid-state image sensor has a global electronic shutter function in order to equalize charge accumulation times among the pixels with each other. In such a solid-state image sensor, each pixel includes, for example, a charge accumulation region, the first charge holding region, the second charge holding region, the first transistor, and the second transistor. The first transistor is arranged between the charge accumulation region and the first charge holding region, and transfers charges from the charge accumulation region to the first charge holding region in accordance with a control signal. The second transistor is arranged between the first charge holding region and the second charge holding region, and transfers the charges from the first charge holding region to the second charge holding region in accordance with a control signal. The first transistors are controlled at once (controlled at substantially the same timing) in the plurality of pixels. This makes it possible to equalize the charge accumulation times among the pixels with each other. Then, the second transistor is controlled while selecting the plurality of pixels on the row basis, and signals each corresponding to an amount of the charges transferred to the second charge holding region of each pixel are read out sequentially as pixel signals.

That is, according to an example of the solid-state image sensor having the above-described global electronic shutter function, two charge transfer operations of the first charge transfer for equalizing the charge accumulation times among the pixels with each other and the second charge transfer for reading out the pixel signals based on thus obtained charges are performed sequentially.

As one of techniques of reducing noise components in the pixel signals, there is known a technique of making the charge accumulation region or the first charge holding region be a buried type. Paying attention to, for example, the charge accumulation region, it is possible to make the charge accumulation region be the buried type by forming, between the charge accumulation region and the upper surface of a semiconductor substrate, an impurity region of a conductivity type different from that of the charge accumulation region. This impurity region will be expressed as a "buried impurity region" hereinafter.

Note that in order to prevent a decrease in charge transfer efficiency by the first transistor, the buried impurity region is not preferably formed immediately below the gate electrode of the first transistor. More specifically, in a planar view (a planar view with respect to the upper surface of the semiconductor substrate; the same applies below), it is preferable that the buried impurity region and the gate electrode do not overlap each other (a gap exists between the buried impurity region and the gate electrode). This also applies to the second transistor.

International Publication No. 11/043432 (for example, FIGS. 6(d) to 6(f)) describes a method of forming a buried impurity region by forming a spacer (side spacer) on the side surface of a gate electrode, and then injecting an impurity using the gate electrode and the spacer as masks. According to this method, the buried impurity region is formed such that the buried impurity region and the gate electrode do not overlap each other in the planar view.

In general, a spacer is formed by forming a member for forming the spacer on a semiconductor substrate and a gate electrode and then etching it back, and silicon nitride or the like having a dielectric constant higher than that of a gate insulating film can be used for the spacer. Thus, forming the spacer can be a cause of increasing a parasitic capacitance applied to the gate electrode. Further, forming the spacer can generally be a cause of preventing scaling of a transistor size. For these reasons, a new technique of forming the buried impurity region without any spacer is required.

SUMMARY OF THE INVENTION

The present invention provides a new technique of making a charge accumulation region or the like be a buried type in a solid-state image sensor having a global electronic shutter function.

One of the aspects of the present invention provides a method of manufacturing a solid-state image sensor, including a charge accumulation region of a first conductivity type formed on a semiconductor substrate, a first charge holding region of the first conductivity type formed on the semiconductor substrate, a first transistor configured to transfer charges from the charge accumulation region to the first charge holding region, a second charge holding region of the first conductivity type formed on the semiconductor substrate, and a second transistor configured to transfer the charges from the first charge holding region to the second charge holding region, the method comprising forming, on the semiconductor substrate, a first resist pattern having a first opening on the charge accumulation region, injecting a first impurity of a second conductivity type via the first opening so as to make the charge accumulation region be a buried type, forming, on the semiconductor substrate, a second resist pattern having a second opening on the first charge holding region, and injecting a second impurity of the second conductivity type via the second opening so as to make the first charge holding region be the buried type, wherein, in the injecting the first impurity, the first impurity is injected in a first direction inclined toward a normal to an upper surface of the semiconductor substrate and headed from a side of the first charge holding region to a side of the charge accumulation region, and, in the injecting the second impurity, the second impurity is injected in a second direction inclined toward the normal and headed from a side of the second charge holding region to the side of the first charge holding region.

Further features of the present invention will become apparent from the following description of exemplary embodiments with reference to the attached drawings.

BRIEF DESCRIPTION OF THE DRAWINGS

FIGS. 3A1 to 3I2 are views for explaining an example of a method of manufacturing a solid-state image sensor;

DESCRIPTION OF THE EMBODIMENTS

Arrangement Example of Solid-State Image Sensor

Figure 1A:
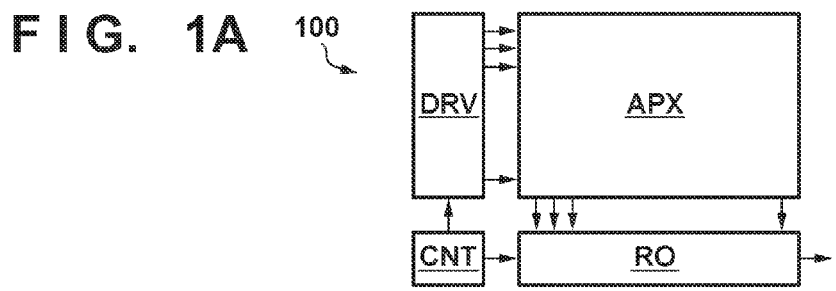
FIGS. 1A to 1C are views for explaining an example of the arrangement of a solid-state image sensor.
Figure 1B:
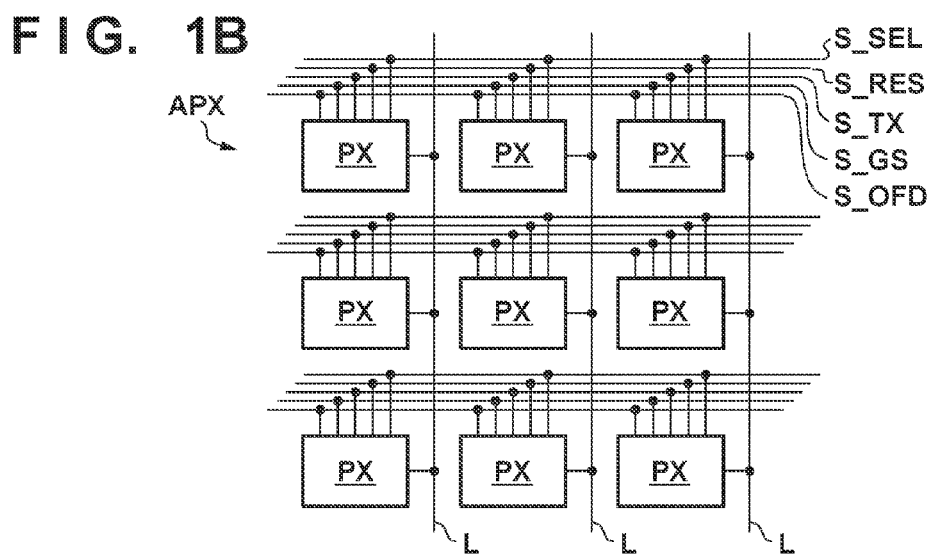

FIG. 1A is a block diagram showing an example of the arrangement of a solid-state image sensor 100. The solid-state image sensor 100 includes, for example, a pixel array APX, a drive unit DRV, a readout unit RO, and a control unit CNT. FIG. 1B shows an example of the arrangement of the pixel array APX. The pixel array APX includes a plurality of pixels PX arrayed so as to form a plurality of rows and a plurality of columns. Each pixel PX can be controlled and driven on the row basis upon receiving a signal (signal S_SEL or the like) from the drive unit DRV. The readout unit RO can read out the signal of the driven pixel PX as a pixel signal via a column signal line L corresponding to the column in which that pixel PX is arranged. The control unit CNT controls the drive unit DRV and the readout unit RO upon receiving a reference signal such as a clock signal, and also controls another unit (not shown) used for an image capturing operation.

The pixel array APX in which the pixels PX are arrayed in 3 (rows)×3 (columns) is shown for easy understanding. However, the number of these pixels is not limited to this example.

Figure 1C:
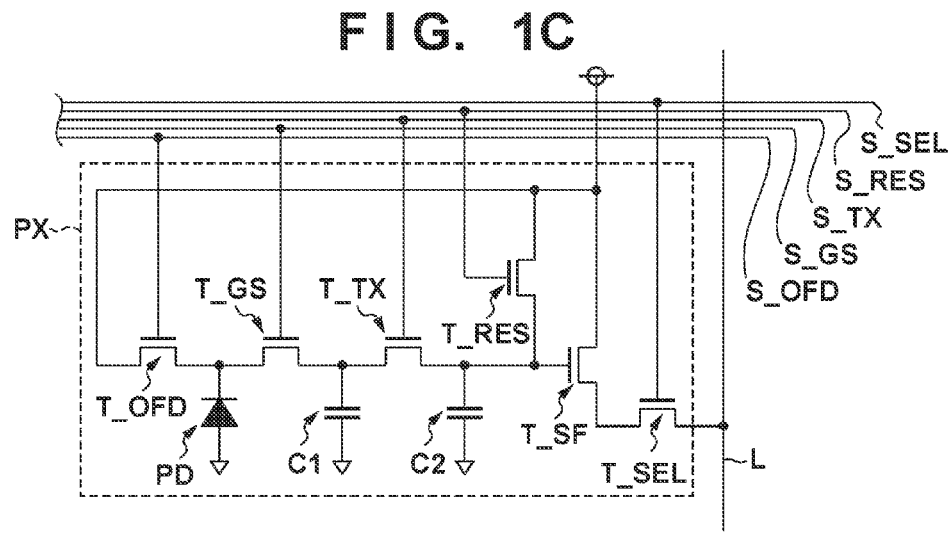

FIG. 1C shows an example of the arrangement of the unit pixel PX. The pixel PX includes, for example, a photoelectric conversion element PD, a first holding unit C1, a second holding unit C2, and MOS transistors T_GS, T_TX, T_SF, T_SEL, T_RES, and T_OFD.

Charges are generated by photoelectric conversion and accumulated in the photoelectric conversion element PD (for example, a photodiode). The transistor T_GS is the first transfer transistor, is turned on upon receiving a signal S_GS, and transfers charges from the photoelectric conversion element PD to the holding unit C1. The transistor T_TX is the second transfer transistor, is turned on upon receiving a signal S_TX, and transfers the charges from the holding unit C1 to the holding unit C2. Each of the holding units C1 and C2 can be formed by an impurity region formed in a semiconductor substrate (for example, a silicon substrate).

The transistor T_SF is an amplification transistor which performs a source follower operation, and its source becomes a potential corresponding to its gate potential (that is, a charge amount of the holding unit C2). The transistor T_SEL is a selection transistor, is turned on upon receiving the signal S_SEL, and outputs, as a pixel signal, a signal of a value corresponding to the source potential of the transistor T_SF to the column signal line L.

The transistor T_RES is a reset transistor, is turned on upon receiving a signal S_RES, and resets the potential of the holding unit C2. The transistor T_OFD is an overflow drain transistor, is turned on upon receiving a signal S_OFD, and discharges the charges of the photoelectric conversion element PD (that is, resets the potential of the photoelectric conversion element PD).

The transistors T_GS of all the pixels PX are controlled at once (almost simultaneously), and the charges are transferred from the photoelectric conversion elements PD to the holding units C1. This substantially equalizes charge accumulation times among the pixels with each other. Then, on the row basis, the charges are transferred from the holding units C1 to the holding units C2 by controlling the transistors T_TX, and the pixel signals are output by controlling the transistors T_SEL. According to such an arrangement example, it is possible to implement the solid-state image sensor 100 having the global electronic shutter function.

Example of Pixel Structure

Figure 2A:
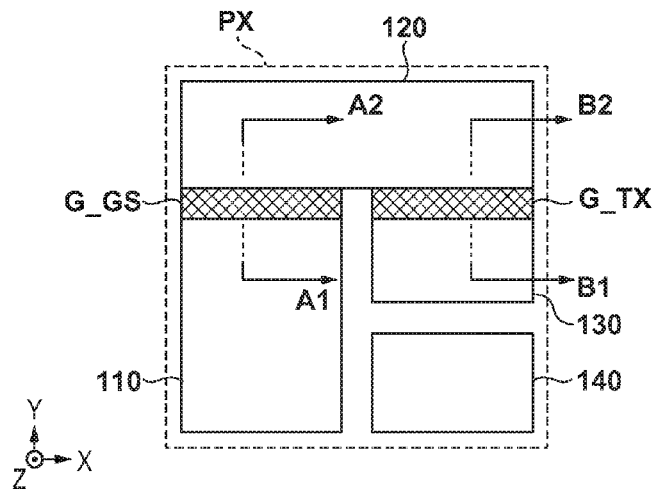
FIGS. 2A to 2C are views for explaining an example of the structure of a pixel.

FIG. 2A is a schematic view showing the layout of the unit pixel PX in the planar view with respect to the upper surface of a semiconductor substrate (to be a semiconductor substrate SUB). In FIG. 2A, let an X direction be one direction parallel to the upper surface of the semiconductor substrate, a Y direction be a direction parallel to the upper surface of the semiconductor substrate and crossing the X direction, and a Z direction be a direction perpendicular to a surface formed by the X direction and the Y direction.

A charge accumulation region 110 partially forms the photoelectric conversion element PD. A first charge holding region 120 partially forms the holding unit C1. Further, a second charge holding region 130 partially forms the holding unit C2. In this example, the charge accumulation region 110 and the charge holding region 120 are adjacent to each other in the X direction, and a gate electrode G_GS of the transistor T_GS is arranged between them. The charge holding region 120 and the charge holding region 130 are adjacent to each other in the X direction, and a gate electrode G_TX of the transistor T_TX is arranged between them. The gate electrode G_GS and the gate electrode G_TX are adjacent to each other in the Y direction, and also adjacent to the charge accumulation region 110 and the charge holding region 130 in the Y direction.

In a region 140 adjacent to the charge accumulation region 110 in the Y direction and adjacent to the charge holding region 130 in the X direction, the other transistors T_SF, T_SEL, T_RES, and T_OFD can be arranged. Note that the respective regions 110 to 140 described above are electrically isolated from each other by the corresponding transistors or an element isolation portion (not shown) such as STI.

Figure 2B:
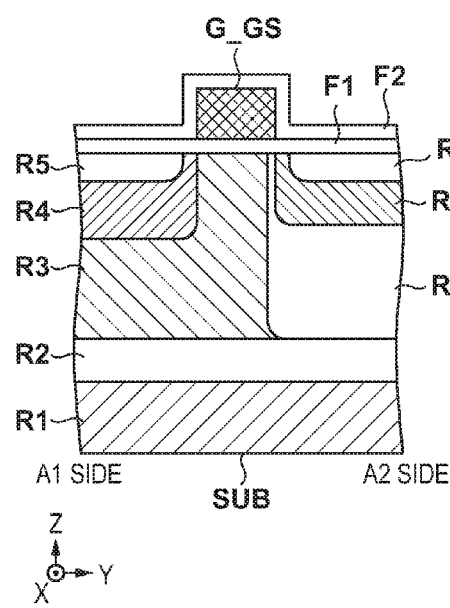
Figure 2C:
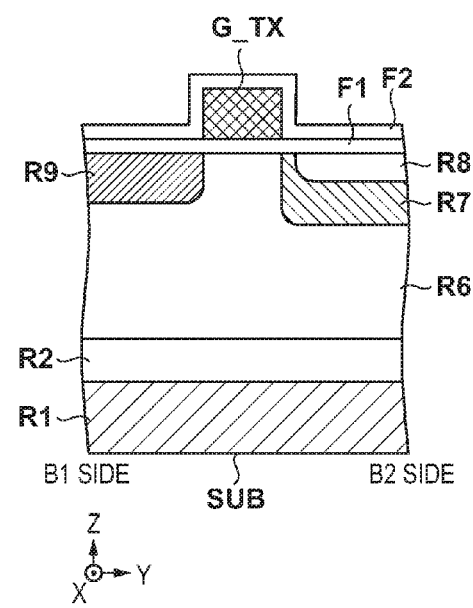

FIG. 2B is a schematic view showing the sectional structure of the pixel PX taken along a cut line A1-A2 in FIG. 2A. FIG. 2C is a schematic view showing the sectional structure of the pixel PX taken along a cut line B1-B2 in FIG. 2A.

On the semiconductor substrate SUB, the gate electrodes G_GS and G_TX are arranged on an insulating film F1. The gate electrodes G_GS and G_TX are covered with an insulating film F2. The insulating film F1 is made of, for example, silicon oxide and corresponds to a gate insulating film. The insulating film F2 is made of, for example, silicon nitride and can act as, for example, an antireflection film.

The semiconductor substrate SUB includes, for example, regions R1 to R9. The region R1 is a semiconductor region of an n type (first conductivity type). The region R2 is a semiconductor region of a p type (second conductivity type) formed on the region R1 and at a position deep from the surface of the semiconductor substrate SUB.

The region R3 is an n-type well region positioned on the region R2. The impurity regions R4 and R5 are formed inside the region R3. The region R4 is an n-type impurity region, corresponds to the aforementioned charge accumulation region 110, and is formed such that its net concentration of an n-type impurity is higher than that in the region R3. That is, the aforementioned photoelectric conversion element PD is formed by a PN junction in the regions R2 to R4, and charges generated by photoelectric conversion are accumulated in the region R4. The region R5 is a p-type impurity region for making the charge accumulation region 110 be the buried type.

Further, the region R6 is a p-type well region formed on the region R2 and inside the region R3. Inside the region R6, the impurity regions R7 and R8, and the impurity region R9 are formed. The region R7 is an n-type impurity region and corresponds to the aforementioned charge holding region 120. The region R8 is a p-type impurity region for making the charge holding region 120 be the buried type. The region R9 is an n-type impurity region and corresponds to the aforementioned charge holding region 130.

In order to prevent a decrease in charge transfer efficiency by the transistor T_GS, the region R5 is preferably formed such that the region R5 and the gate electrode G_GS do not overlap each other (a gap exists between the region R5 and the gate electrode G_GS) in the planar view. Similarly, in order to prevent a decrease in charge transfer efficiency by the transistor T_TX, the region R8 is preferably formed such that the region R8 and the gate electrode G_TX do not overlap each other in the planar view.

Example of Method of Manufacturing Solid-State Image Sensor

An example of a method of manufacturing a solid-state image sensor 100 will be described with reference to FIGS. 3A1 to 3I1 and FIGS. 3A2 to 3I2. The solid-state image sensor 100 can be manufactured by using a well-known semiconductor manufacturing process.

FIGS. 3A1 to 3I1 and FIGS. 3A2 to 3I2 are views for explaining states of steps. Each of FIGS. 3A1 to 3I1 shows a structure in the corresponding step corresponding to FIG. 2B. Each of FIGS. 3A2 to 3I2 shows a structure in the corresponding step corresponding to FIG. 2C. Each of FIGS. 3A1 and 3A2 shows the structure in the same step. The same also applies to the views from FIGS. 3B1 and 3B2.

In the step of FIGS. 3A1 and 3A2, a semiconductor substrate SUB is prepared in which an n-type region R1, a p-type region R2, and an n-type region R3 are formed from a deeper side to a shallower side. This step may be performed by, for example, injecting a p-type impurity into a position at a predetermined depth from the surface of an n-type semiconductor substrate with respect to the n-type semiconductor substrate, and then injecting an n-type impurity into a position shallower than a p-type impurity region formed by the injection to form an n-type well. In another example, this step may also be performed by epitaxially growing a p-type semiconductor member on the n-type semiconductor substrate and further epitaxially growing an n-type semiconductor member on it.

Note that typically, phosphorus (P), arsenic (As), or the like is used for an n-type impurity, and boron (B) or the like is used for a p-type impurity. The same also applies to the steps from this.

In the step of FIGS. 3B1 and 3B2, a resist pattern RP1 is formed on the substrate SUB, and then the p-type impurity is injected. The resist pattern RP1 has an opening OP1. The p-type impurity is injected via the opening OP1, thereby forming a p-type region R6 inside the n-type region R3. In this example, the n-type region R3 of FIG. 3B1 is made of a p type in part, and the n-type region R3 of FIG. 3B2 is made of the p type as a whole, thereby forming the region R6. Then, the resist pattern RP1 is removed.

In the step of FIGS. 3C1 and 3C2, a resist pattern RP2 is formed on the substrate SUB, and then the n-type impurity is injected. The resist pattern RP2 has an opening OP2. The n-type impurity is injected via the opening OP2, thereby forming an n-type region R4 inside the region R3. In this example, in FIG. 3B1, the region R4 is formed at a position away from the region R6. As described above, the region R4 corresponds to a charge accumulation region 110. Then, the resist pattern RP2 is removed.

In the step of FIGS. 3D1 and 3D2, a resist pattern RP3 is formed on the substrate SUB, and then the n-type impurity is injected. The resist pattern RP3 has an opening OP3. The n-type impurity is injected via the opening OP3, thereby forming an n-type region R7 inside the p-type region R6. As described above, the region R7 corresponds to a charge holding region 120. Then, the resist pattern RP3 is removed.

In the step of FIGS. 3E1 and 3E2, an insulating film F1 is formed on the semiconductor substrate SUB, and a conductive member G0 is further formed on it. For example, the insulating film F1 can be made of silicon oxide and formed by oxidation for the semiconductor substrate SUB. For example, the conductive member G0 can be made of polysilicon and formed by a deposition method.

In the step of FIGS. 3F1 and 3F2, the conductive member G0 is patterned to form gate electrodes G_GS and G_TX.

In the step of FIGS. 3G1 and 3G2, a resist pattern RP4 is formed so as to cover the semiconductor substrate SUB and the gate electrodes G_GS and G_TX, and then the n-type impurity is injected. The resist pattern RP4 has an opening OP4. The n-type impurity is injected via the opening OP4, thereby forming an n-type region R9 inside the p-type region R6. In this example, in FIG. 3G2, the region R9 is formed at a position away from the region R7. As described above, the region R9 corresponds to a charge holding region 130. Then, the resist pattern RP4 is removed.

In the step of FIGS. 3H1 and 3H2, a resist pattern RP5 is formed so as to cover the semiconductor substrate SUB and the gate electrodes G_GS and G_TX, and then the p-type impurity is injected. The resist pattern RP5 has an opening OP5. The p-type impurity is injected via the opening OP5, thereby forming a p-type region R5 inside the n-type region R4. As described above, the region R5 is an impurity region for making the charge accumulation region 110 be a buried type. Then, the resist pattern RP5 is removed.

In this step, the resist pattern RP5 is formed such that the opening OP5 exposes a part of the upper surface of the gate electrode G_GS which is a portion on the side of the region R4 corresponding to the charge accumulation region 110. That is, in a planar view, the portion on the side of the region R4 of the gate electrode G_GS and the opening OP5 overlap each other. The p-type impurity is injected in a direction inclined toward the normal to the upper surface of the semiconductor substrate SUB. The direction (angle) of the injection is fixed to the semiconductor substrate SUB during this step, that is, fixed together with a wafer as a processing target while injecting the p-type impurity. The direction of the injection can be determined based on the distance from the region R5 that should be formed to the end of the gate electrode G_GS and the height of the gate electrode G_GS. In this determination, the thickness of a coating which covers the gate electrode G_GS can also be considered if the coating exists, and/or the diffusion length of thermal diffusion processing of the injected p-type impurity can also be considered if that processing is performed. With this step, it is possible to form the region R5 at a position away from the end of the gate electrode G_GS. It is also possible to adjust the position of the region R5 by changing the injecting direction of the p-type impurity.

In the step of FIGS. 3I1 and 3I2, a resist pattern RP6 is formed so as to cover the semiconductor substrate SUB and the gate electrodes G_GS and G_TX, and then the p-type impurity is injected. The resist pattern RP6 has an opening OP6. The p-type impurity is injected via the opening OP6, thereby forming a p-type region R8 inside the n-type region R7. An element which is the same as the p-type impurity used in the step of FIG. 3H1 and 3H2 may be used as the p-type impurity. As described above, the region R8 is an impurity region for making the charge holding region 120 be the buried type. Then, the resist pattern RP6 is removed.

Note that the opening OP6 overlaps a portion on the side of the region R7 (the region corresponding to the charge holding region 120) of the gate electrode G_TX in the planar view. By performing this step in the same procedure as that for the step of FIGS. 3H1 and 3H2, it is possible to form the region R8 at a position away from the end of the gate electrode G_TX. In this example, the injecting direction of the p-type impurity in this step can be determined such that a component parallel to the upper surface of the semiconductor substrate SUB is oriented in the opposite direction to a component parallel to the upper surface of the semiconductor substrate SUB of the injecting direction of the p-type impurity in the step of FIGS. 3H1 and 3H2. Note that the "component" here refers to a vector component obtained when a certain direction is divided into two or more directions (in this example, two directions of the vertical direction and the horizontal direction), and the component parallel to the upper surface of the semiconductor substrate SUB in the above-described injecting direction refers to a vector component in the horizontal direction of the injecting direction.

After the step of FIGS. 3I1 and 3I2, the aforementioned structures of FIGS. 2B and 2C are obtained by forming an insulating film F2 which covers the semiconductor substrate SUB, and the gate electrodes G_GS and G_TX. Then, a wiring structure can be formed on the structures in a well-known procedure.

Note that a desirable process (for example, a cleaning process, annealing, or the like) may be performed as needed in each step or between the respective steps, though it is omitted here for easy understanding. Further, the order of the above-described steps may partially be changed as needed.

According to this manufacturing method, a step of forming a spacer (side spacer) on the side surface of the gate electrode G_GS or the like can be omitted. Without arranging the spacer, it is possible to decrease a parasitic capacitance that can be applied to the gate electrode G_GS or the like. Without arranging the spacer, it is also advantageous to scale a transistor T_GS or the like. Therefore, according to this manufacturing method, it is advantageous to make each of the charge accumulation region 110 and the charge holding region 120 be the buried type in the solid-state image sensor 100 having the global electronic shutter function.

First Modification

Figure 4:
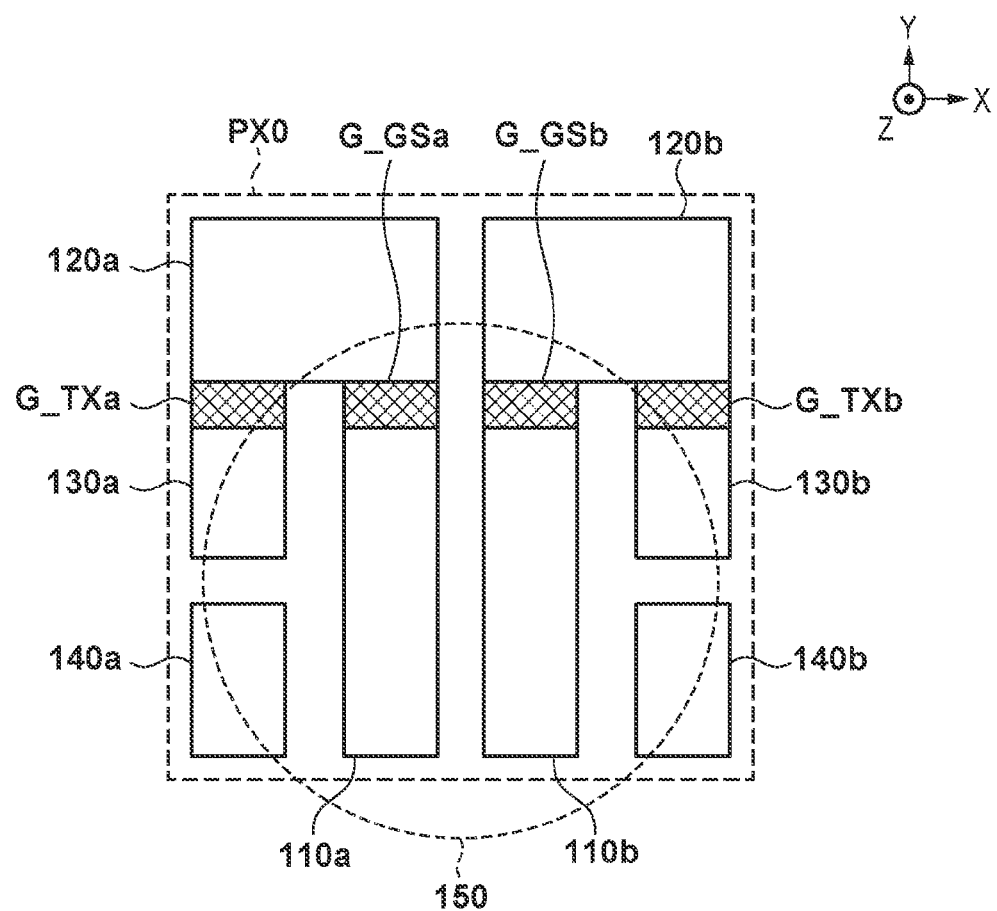
FIG. 4 is a view for explaining an example of the structure of a pixel.

As the first modification, FIG. 4 shows the layout of a unit pixel PX0 as in FIG. 2A described above. In this example, the pixel PX0 has two groups, assuming that the charge accumulation region 110, the charge holding regions 120 and 130, the gate electrodes G_GS and G_TX, and the region 140 form one group. The arrangement in this example can be used for, for example, a focus detection pixel for performing focus detection based on a phase-difference detection method.

In FIG. 4, reference character "a" is added to each constituent element of one group, and reference character "b" is added to each constituent element of the other group for the sake of distinguishment. For example, the charge accumulation region 110 for one group is indicated as a "charge accumulation region 110a", and the charge accumulation region 110 for the other group is indicated as a "charge accumulation region 110b".

In this example, the two groups are preferably arranged so as to have a line-symmetric mutual relationship (mirror symmetry). When the two groups are adjacent to each other in the X direction, it is preferable that the charge accumulation region 110a and the charge accumulation region 110b are adjacent to each other in the X direction, and are positioned between a charge holding region 130a and a charge holding region 130b. According to such a layout, it is possible to form a single microlens 150 above both the charge accumulation region 110a and the charge accumulation region 110b.

Second Modification

Figure 5:
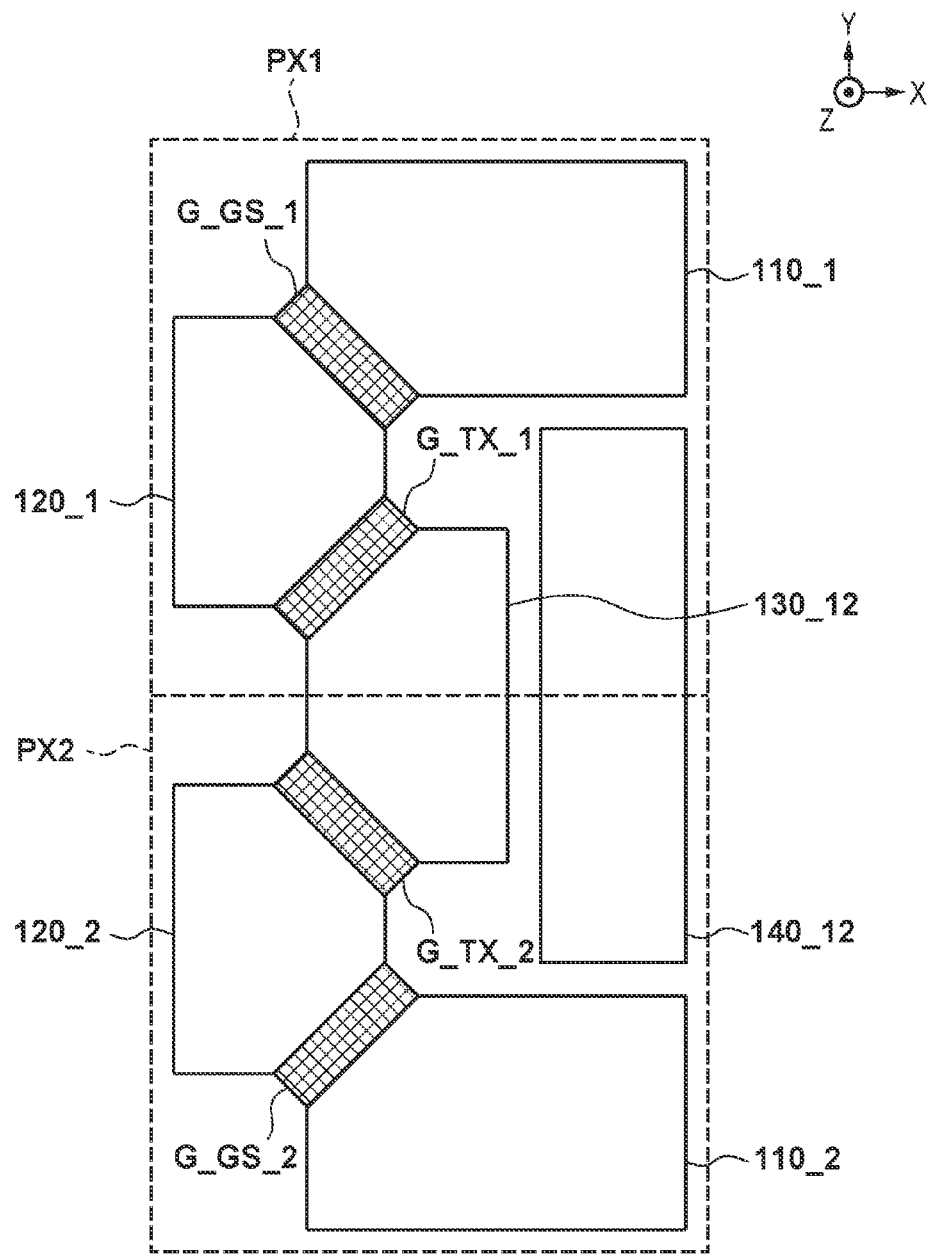
FIG. 5 is a view for explaining an example of the structure of a pixel.

As the second modification, FIG. 5 shows the layout of two pixels PX1 and PX2 adjacent to each other in the Y direction as in FIG. 2A described above. This example will be described here while paying attention to the pixels PX1 and PX2. However, the same also applies to two other pixels adjacent to each other.

In this example, the charge accumulation region 110, the charge holding region 120, and the gate electrodes G_GS and G_TX form the unit pixel PX1 or PX2. In FIG. 5, reference numeral "_1" is added to each constituent element of the pixel PX1, and reference numeral "_2" is added to each constituent element of the pixel PX2 for the sake of distinguishment. For example, the charge accumulation region 110 is indicated as a "charge accumulation region 110_1" in the pixel PX1, and a "charge accumulation region 110_2" in the pixel PX2. The two pixels PX1 and PX2 share a charge holding region 130_12 and a region 140_12 in their boundary region.

In this example, the two pixels PX1 and PX2 are preferably arranged so as to have a line-symmetric mutual relationship. More specifically, for example, paying attention to the pixel PX1, a charge holding region 120_1 is formed at a shifted position with respect to the charge holding region 130_12 in both the Y direction and a direction crossing it (the opposite direction to the X direction in FIG. 5). The charge accumulation region 110_1 is formed at a shifted position with respect to the charge holding region 120_1 in both the Y direction and the X direction.

According to the above-described arrangement, in the step of FIGS. 3H1 and 3H2 described above, the injecting direction of the p-type impurity is preferably determined such that the component parallel to the upper surface of the semiconductor substrate SUB becomes almost equal to that in the X direction. Further, in the step of FIGS. 3I1 and 3I2, the injecting direction of the p-type impurity is preferably determined such that the component parallel to the upper surface of the semiconductor substrate SUB becomes almost equal to that in the opposite direction to the X direction. That is, in the planar view, the injecting direction of the p-type impurity in the step of FIGS. 3H1 and 3H2 and the injecting direction of the p-type impurity in the step of FIGS. 3I1 and 3I2, and the X direction can almost be parallel to each other.

In another aspect, it can also be said that a charge transfer direction by the transistor T_GS and the injecting direction of the p-type impurity in the step of FIGS. 3H1 and 3H2 need not always be parallel to each other, and the injecting direction suffices to include the component in the transfer direction. Accordingly, as a result of the step in FIGS. 3H1 and 3H2, the impurity region R5 for making the charge accumulation region 110 be the buried type is formed at the position away from the end of the gate electrode G_GS. The same also applies to the relationship between a charge transfer direction by the transistor T_TX and the injecting direction of the p-type impurity in the step of FIGS. 3I1 and 3I2.

Others

Some preferred examples have been exemplified above. However, the present invention is not limited to these examples. Some of them may be changed without departing from the scope of the present invention.

Figure 6:
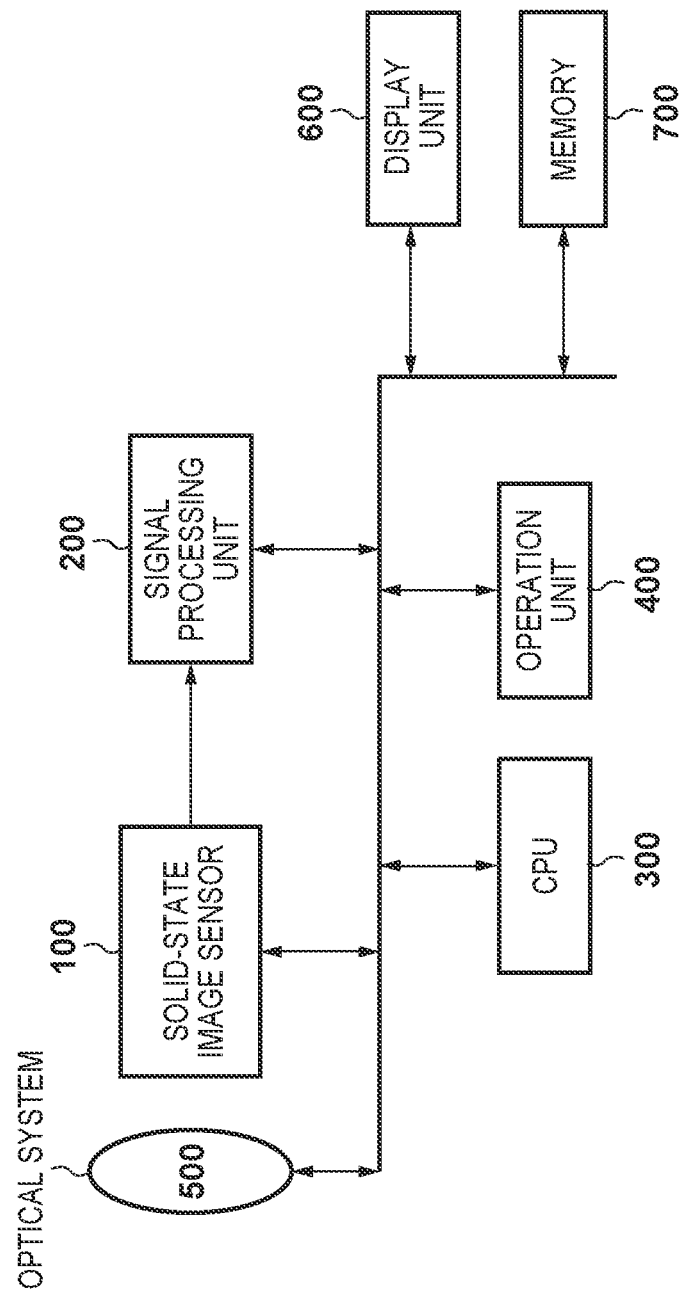
FIG. 6 is a block diagram for explaining an example of the arrangement of a camera.

FIG. 6 is a block diagram for explaining an example of the arrangement of a camera to which the solid-state image sensor 100 shown in the above examples is applied. Besides the solid-state image sensor 100, the camera includes, for example, a processing unit 200, a CPU 300 (or a processor), an operation unit 400, and an optical system 500. The camera can further include a display unit 600 configured to display a still image and a moving image to a user, and a memory 700 configured to store their data. The solid-state image sensor 100 generates image data based on light that has passed through the optical system 500. The image data undergoes predetermined correction processing by the processing unit 200, and is output to the display unit 600 and the memory 700. The CPU 300 can change setting information of each unit or change a control method of each unit in accordance with a shooting condition input by the user via the operation unit 400. Note that the concept of the camera includes not only an apparatus mainly aiming at shooting but also an apparatus (for example, a personal computer or a portable terminal) accessorily having a shooting function.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2015-149813, filed on Jul. 29, 2015, which is hereby incorporated by reference herein in its entirety.

What is claimed is:
1. A method of manufacturing a solid-state image sensor, including
    a charge accumulation region of a first conductivity type formed on a semiconductor substrate,
    a first charge holding region of the first conductivity type formed on the semiconductor substrate,
    a first transistor configured to transfer charges from the charge accumulation region to the first charge holding region,
    a second charge holding region of the first conductivity type formed on the semiconductor substrate, and
    a second transistor configured to transfer the charges from the first charge holding region to the second charge holding region,
the method comprising:
    forming, on the semiconductor substrate, a first resist pattern having a first opening on the charge accumulation region;
    injecting a first impurity of a second conductivity type via the first opening so as to make the charge accumulation region be a buried type;
    forming, on the semiconductor substrate, a second resist pattern having a second opening on the first charge holding region; and
    injecting a second impurity of the second conductivity type via the second opening so as to make the first charge holding region be the buried type,
    wherein, in the injecting the first impurity, the first impurity is injected in a first direction inclined toward a normal to an upper surface of the semiconductor substrate and headed from a side of the first charge holding region to a side of the charge accumulation region, and, in the injecting the second impurity, the second impurity is injected in a second direction inclined toward the normal and headed from a side of the second charge holding region to the side of the first charge holding region.

2. The method according to claim 1, wherein a charge transfer direction from the charge accumulation region to the first charge holding region by the first transistor and
    a charge transfer direction from the first charge holding region to the second charge holding region by the second transistor are opposite directions.

3. The method according to claim 1, wherein, in a planar view with respect to the upper surface of the semiconductor substrate, the first opening overlaps a portion of a first gate electrode of the first transistor on a side of the charge accumulation region, and the second opening overlaps a portion of a second gate electrode of the second transistor on a side of the first charge holding region.

4. The method according to claim 3, wherein, in the injecting the first impurity, a side spacer is not formed on a side surface of the first gate electrode on the side of the charge accumulation region, and, in the injecting the second impurity, a side spacer is not formed on a side surface of the second gate electrode on the side of the first charge holding region.

5. The method according to claim 3, wherein, in the injecting the first impurity, a first impurity region of the second conductivity type configured to make the charge accumulation region be the buried type is formed at a position away from an end of the first gate electrode on the side of the charge accumulation region, and,
    in the injecting the second impurity, a second impurity region of the second conductivity type configured to make the first charge holding region be the buried type is formed at a position away from an end of the second gate electrode on the side of the first charge holding region.

6. The method according to claim 5, wherein, in the injecting the second impurity, the second impurity region is further formed at a position away from an end of the first gate electrode on the side of the first charge holding region.

7. The method according to claim 5, wherein, in the injecting the first impurity, the first direction is determined based on a distance from the end of the first gate electrode on the side of the charge accumulation region to the first impurity region that should be formed after the injecting and a height of the first gate electrode, and,
    in the injecting the second impurity, the second direction is determined based on a distance from the end of the second gate electrode on the side of the first charge holding region to the second impurity region that should be formed after the injecting and a height of the second gate electrode.

8. The method according to claim 1, wherein, in the injecting the first impurity, injection of the first impurity is performed while fixing a wafer serving as a target object of the injection and including the semiconductor substrate in the first direction, and, in the injecting the second impurity, injection of the second impurity is performed while fixing the wafer in the second direction.

9. The method according to claim 1, wherein the same element is used as the first impurity and the second impurity.

10. The method according to claim 3, further comprising, before the forming the first resist pattern, forming the charge accumulation region, the first charge holding region, the second charge holding region, the first gate electrode, and the second gate electrode on the semiconductor substrate such that:

the charge accumulation region and the first charge holding region are adjacent to each other in a third direction via the first gate electrode;

the first charge holding region and the second charge holding region are adjacent to each other in the third direction via the second gate electrode;

the first gate electrode and the second gate electrode are adjacent to each other in a fourth direction crossing the third direction; and the charge accumulation region and the second charge holding region are adjacent to each other in the fourth direction.

11. The method according to claim 10, wherein a component parallel to the upper surface of the semiconductor substrate in the first direction and a component parallel to the upper surface in the second direction have opposite directions.

12. The method according to claim 10, wherein assuming that the charge accumulation region, the first charge holding region, the second charge holding region, the first gate electrode, and the second gate electrode form one group, the solid-state image sensor has two groups, and in the forming the charge accumulation region, the first charge holding region, the second charge holding region, the first gate electrode, and the second gate electrode on the semiconductor substrate, the charge accumulation regions, the first charge holding regions, the second charge holding regions, the first gate electrodes, and the second gate electrodes of the two groups are formed such that the two groups have a line-symmetric relationship while being adjacent to each other.

13. The method according to claim 12, wherein, in the forming the charge accumulation region, the first charge holding region, the second charge holding region, the first gate electrode, and the second gate electrode on the semiconductor substrate, the charge accumulation region of one of the two groups and the charge accumulation region of the other of the two groups are formed between the second charge holding region of the one of the two groups and the second charge holding region of the other of the two groups, and the method further includes forming a single microlens above both the charge accumulation region of the one of the two groups and the charge accumulation region of the other of the two groups after the injecting the second impurity.

14. The method according to claim 3, wherein the charge accumulation region, the first charge holding region, the first gate electrode, and the second gate electrode form one pixel, the solid-state image sensor includes a plurality of pixels, two pixels out of the plurality of pixels adjacent to each other in a fifth direction share the second charge holding region in a boundary region between the two pixels, the method further includes, before the forming the first resist pattern, forming the charge accumulation region, the first charge holding region, the second charge holding region, the first gate electrode, and the second gate electrode on the semiconductor substrate such that:

for one of the two pixels, the first charge holding region is positioned with being shifted with respect to the second charge holding region of the boundary region both in the fifth direction and a sixth direction crossing the fifth direction;

the charge accumulation region is positioned with being shifted with respect to the first charge holding region both in the fifth direction and an opposite direction to the sixth direction;

the first gate electrode is positioned between the charge accumulation region and the first charge holding region, and the second gate electrode is positioned between the first charge holding region and the second charge holding region; and the other of the two pixels has a line-symmetric relationship to the one of the two pixels.

15. The method according to claim 14, wherein a component parallel to an upper surface of the semiconductor substrate in the first direction, a component parallel to the upper surface in the second direction, and the sixth direction are parallel to each other.

* * * * *